US012570155B2

(12) United States Patent
Koehler

(10) Patent No.: US 12,570,155 B2
(45) Date of Patent: Mar. 10, 2026

(54) METHOD FOR MONITORING THE SUPPLY OF ENERGY TO A MOTOR VEHICLE

(71) Applicant: Robert Bosch GmbH, Stuttgart (DE)

(72) Inventor: Armin Jens Koehler, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 197 days.

(21) Appl. No.: 18/260,167

(22) PCT Filed: Nov. 25, 2021

(86) PCT No.: PCT/EP2021/083006
§ 371 (c)(1),
(2) Date: Jun. 30, 2023

(87) PCT Pub. No.: WO2022/179724
PCT Pub. Date: Sep. 1, 2022

(65) Prior Publication Data
US 2024/0326600 A1 Oct. 3, 2024

(30) Foreign Application Priority Data

Feb. 25, 2021 (DE) ..................... 10 2021 104 535.5

(51) Int. Cl.
*B60L 3/00* (2019.01)
*B60L 3/12* (2006.01)
*G01R 31/00* (2006.01)
(52) U.S. Cl.
CPC ............... *B60L 3/12* (2013.01); *B60L 3/0023* (2013.01); *G01R 31/007* (2013.01)
(58) Field of Classification Search
CPC ...... B60L 3/12; B60L 3/0023; B60L 2260/50; B60L 3/00; G01R 31/007

USPC ......................................................... 701/29.1
See application file for complete search history.

(56) References Cited

U.S. PATENT DOCUMENTS

| | | | |
|---|---|---|---|
| 2007/0168096 A1* | 7/2007 | Boutin ..................... | G05B 9/03 |
| | | | 701/45 |
| 2009/0326841 A1* | 12/2009 | Zhang .................. | G01R 31/367 |
| | | | 706/20 |
| 2012/0140371 A1* | 6/2012 | Gaul ......................... | B60L 3/04 |
| | | | 361/93.6 |

FOREIGN PATENT DOCUMENTS

| | | |
|---|---|---|
| DE | 102018130369 A1 | 7/2019 |
| WO | 2019145087 A1 | 8/2019 |

OTHER PUBLICATIONS

International Search Report forPCT/EP2021/083006, Issued Mar. 14, 2022.
Standard ISO 26262-6, Road Vehicles—Functional Safety—Part 6: Product Development at the Software Level, Second Edition, 2018, pp. 1-66.

(Continued)

*Primary Examiner* — Shardul D Patel
(74) *Attorney, Agent, or Firm* — NORTON ROSE FULBRIGHT US LLP

(57) ABSTRACT

A method for monitoring a safety-relevant electrical component of a motor vehicle, in particular for a self-driving function. A safety-relevant component is provided for a motor vehicle. A cyclic diagnosis of the safety-relevant component is carried out. A metric for failure probability is determined for the safety-relevant component by using a piecewise- and thus time-dependently defined failure rate of the component.

16 Claims, 6 Drawing Sheets

(56)          References Cited

OTHER PUBLICATIONS

Kohler et al., "An Approach of Fail Operational Power Supply for Next Generation Vehicle Powernet Architectures," Proceedings of the 30th European Safety and Reliability Conference and the 15th Probabilistic Safety Assessment and Management Conference, 2020, pp. 60-67.

Velten-Philipp et al., "The Effect of Diagnostic and Periodic Proof Testing on the Availability of Programmable Safety Systems," Proceedings of the 10th WSEAS International Conference on Communications, 2006, pp. 180-186.

* cited by examiner

METHOD FOR MONITORING THE SUPPLY OF ENERGY TO A MOTOR VEHICLE

FIELD

The present invention relates to a method for monitoring the power supply to a motor vehicle.

BACKGROUND INFORMATION

A method is described in PCT Application No. WO 2019/145087 A1 for monitoring the power supply to a motor vehicle with self-driving functions. As a function of a load profile for transferring the vehicle into a safe state, at least one parameter of the energy storage system is predicted and, as a function of the predicted parameter of the energy storage system, the associated mode of operation and/or the self-driving functions is/are enabled. The predicted parameter is determined as a function of a base load and/or a shutdown potential of the consumer not required for the mode of operation.

Advanced Driver Assistance Systems (ADAS) and self-driving functions are a current area of innovation. Most of these systems have one thing in common: they are part and parcel of the electrical and/or electronic (E/E) systems which are responsible for the safety of drivers and bystanders. The basic principle of functionality here is always the supply of sufficient power to these safety-relevant systems or associated components. As a result, vehicle electrical systems and related components are of greatly increased relevance to safety. For this reason, the entire vehicle electrical system has to be developed and certified in accordance with functional safety standards. In the field of road vehicles, in particular, the functional safety process according to ISO 26262 must be applied.

At present, the process of developing vehicle electrical systems is limited to the analysis of voltage stability and load balancing. Future developments will have additionally to take account of legislation, functional safety, industrial standards—in particular ISO 26262—and reliability. Various technical measures at the vehicle electrical system level, such as smart switching modules or (predictive) system diagnostics, are therefore inevitable. ISO 26262 specifies a comprehensive safety analysis for this type of safety system. Quantitative assessment is therefore based in particular on calculating the Probabilistic Metric for Random Hardware Failures (PMHF). Due to its DC (Diagnostic Coverage) values, the PMHF value is strongly influenced by the safety diagnostics or safety measures implemented.

Safety measures/safety mechanisms/diagnostics, though of practical and definitely effective benefit, must not form part of the PMHF calculation in the safety case where they violate the criterion of a continuous/static safety measure.

An object of the present invention is to provide a simple way of increasing the reliability and simultaneously the availability in particular of self-driving functions and of the necessary power supply. This object may be achieved by features of the present invention.

SUMMARY

According to an example embodiment of the present invention, because a component failure rate which is defined piecewise and thus time-dependently is used to determine a metric for failure probability for the safety-relevant component, those safety measures/safety mechanisms/diagnostics which cannot be considered to be continuous/static systems due to cycling can be positively included in the safety case. This particularly affects systems which are based on hourly diagnoses before beginning travel, as is frequently standard in the automotive sector.

To achieve the same positive effects in the safety case, cost-intensive hardware adaptations or fundamentally new monitoring concepts would otherwise have to be developed.

One convenient further development of the present invention provides for the failure rate to exhibit a jump in its time profile at least at one point, preferably at two points. In this way, conventional failure phenomena may typically be adequately taken into account, in particular in cyclic operation.

According to the present invention, one convenient further development provides for a period of a controllable fault of a component and/or a period of an uncontrollable fault of a component to be determined for cyclic diagnosis with a diagnosis period. Furthermore, the piecewise- and time-defined failure rate may be specifically modeled as a function of the respective component or the diagnosis used. In this way, account is taken of the fact that cyclic diagnoses also make a positive contribution to increasing monitoring concept reliability.

One convenient further development of the present invention provides for a constant failure rate, in particular a failure rate for unidentified hazardous faults, to be assigned to the period of a controllable fault, and/or for a further constant failure rate, in particular a failure rate of hazardous faults of the component, to be assigned to the period of an uncontrollable fault. In this way, when using cyclic diagnostic methods, the failure rates based on continuous component monitoring can be used as the basis for determining failure probability. In a preferred alternative configuration of the present invention, a specific distribution, for example a Weibull distribution, could be used for the failure rate. This would allow the failure rates to be relatively accurately modeled.

One convenient further development of the present invention provides for the piecewise- and thus time-dependently defined failure rate to be integrated and/or for a weighted average to be determined from the piecewise- and thus time-dependently defined failure rate, in order to obtain a metric for failure probability. The piecewise- and thus time-dependently defined failure rate profile is thus adequately taken into account when determining failure probability. The use of a weighted average simplifies the numerical determination of failure probability.

One convenient further development of the present invention provides for the following differential equation to be solved to determine a failure probability and/or a survival probability, $\lambda_{RF}$ denoting the piecewise- and thus time-dependently defined failure rate:

$$\frac{dR}{dt} = \dot{R}(t) = -f(t) = -R(t) \cdot \lambda_{RF}(t)$$

$$R(0) = 1$$

This takes account of the fact that, in the case of piecewise- and thus time-dependently defined failure rates, the failure-describing options are not subject to the laws of exponential distribution, so increasing accuracy.

One convenient further development of the present invention provides for a failure probability and/or a survival probability to be determined as a function of the piecewise-defined failure rate, in particular by integration of the failure rate in the exponent of survival probability. This is a precise functional solution to the above-stated differential equation and is distinguished by simplified implementation within a numerical calculation. A probability density function is particularly preferably determined by way of the product of the failure rate and an exponential function with a negative integral over the failure rate in the exponent of the exponential function.

One convenient further development provides for failure probability to be calculated using the following (approximated) formula:

$$F(t) \quad F(t)_{cycl} = 1 - e^{-(1-K_c DC_{stat})\lambda_D \cdot t} = 1 - e^{-(1-DC_{cycl})\lambda_D \cdot t}$$

in which $K_c = t_c/(t_c+t_d)$, $t_c$ denotes the period of a controllable fault of the component, $t_d$ denotes the period of an uncontrollable fault of the component, DCstat denotes a diagnostic coverage, in particular a percentage of the failure rate identified using a static or continuous diagnosis, DCcycl denotes a diagnostic coverage, in particular a percentage of the diagnostically identified failure rate during cyclic diagnosis, and $\lambda_d$ denotes a failure rate of hazardous faults of the component.

Implementation is thus further simplified. Using this approximation, system behavior can be described in accordance with the equation.

One convenient further development of the present invention provides for a failure rate for hazardous faults to be assigned during a static or continuous diagnosis for the purpose of determining the metric for failure probability for the safety-relevant component, and/or for a percentage of the failure rate for hazardous faults of the safety-relevant component as is identified during a static or continuous diagnosis to be used as diagnostic coverage. In this way, conventionally known values can be used within the context of a static or continuous diagnosis and simply recalculated for a cyclic diagnostic case. Provision is particularly conveniently made to this end for a cyclic diagnostic coverage to be determined as a function of a static diagnostic coverage and/or a quotient of the period of an uncontrollable fault and a sum of the period of a controllable fault and the period of an uncontrollable fault and/or of a quotient of a period of a controllable fault and a period of a completed cyclic diagnosis and/or of a failure rate for hazardous faults. This includes the specific temporal conditions, namely the periods of the controllable or uncontrollable fault.

One convenient further development of the present invention is characterized by the use in at least two alternating diagnoses. The probability function can particularly preferably be determined as follows in particular in the case of alternating first and at least second diagnoses:

$$F(t) = 1 - e^{-(1-(K_{c1} \cdot DC_{stat_1} + (1-K_{c1}) \cdot DC_{stat_2})) \cdot \lambda_D \cdot t}$$

in which $K_{ci} = t_{ci}/(t_{ci}+t_{di})$, $t_{ci}$ denotes the period of a controllable fault of the component, $t_{di}$ denotes the period of an uncontrollable fault of the component, DCstat_i denotes a diagnostic coverage, in particular a percentage of the failure rate identified using a static or continuous diagnosis, $\lambda_d$ denotes the failure rate of hazardous faults of the component, and i equals 1 (for the first diagnosis) or 2 (for the second diagnosis).

This allows simple modeling even of a plurality of cyclic diagnoses.

In a convenient further development of the present invention, at least one control device and/or at least one sensor and/or at least one electronic power distribution board is provided for diagnosis of the component. In this way, corresponding cyclic diagnoses can be performed in pre-existing components.

Additional convenient further developments of the present invention are disclosed herein.

DETAILED DESCRIPTION OF EXAMPLE EMBODIMENTS

The present invention is illustrated schematically on the basis of an exemplary embodiment and is described in detail below with reference to the figures.

Figure 1:
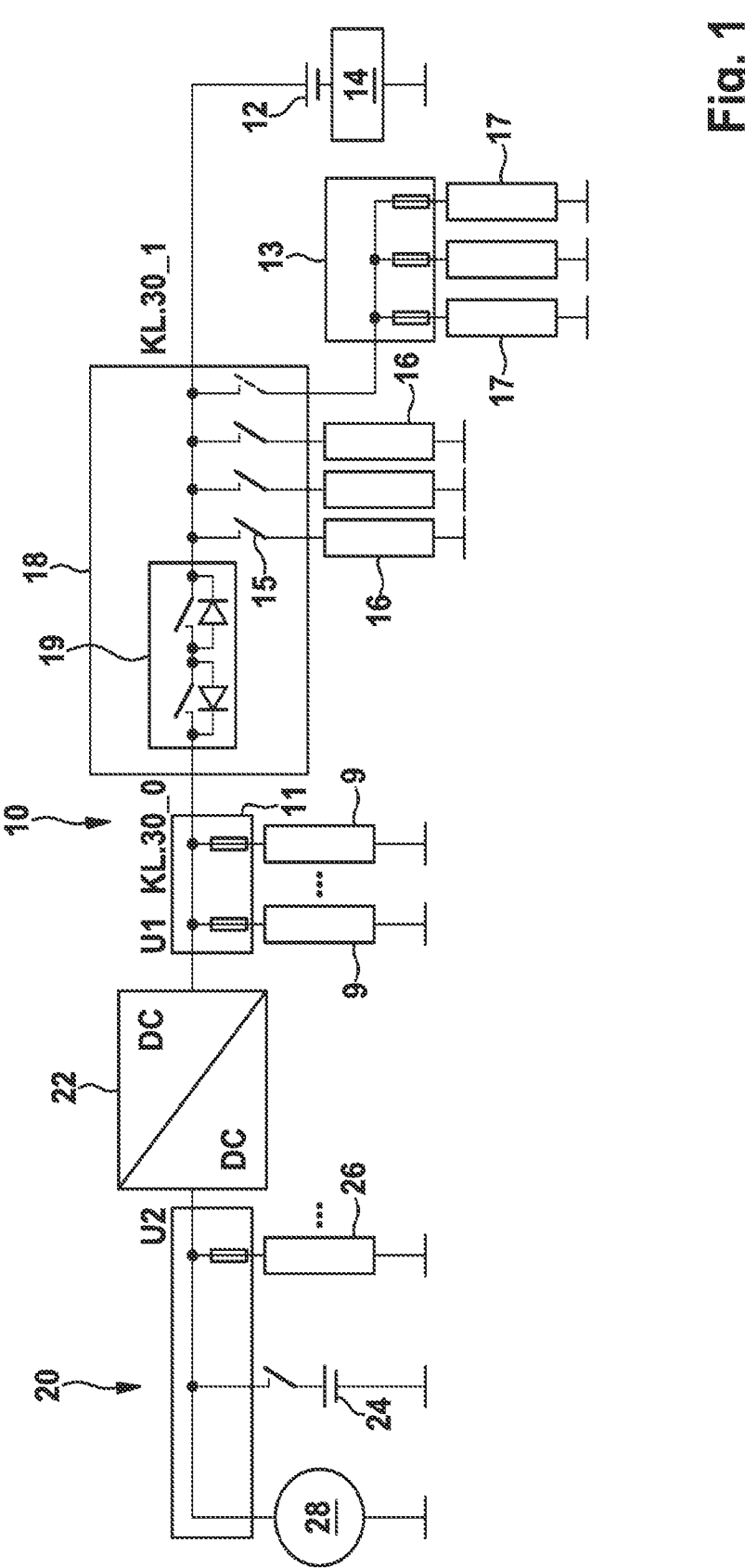
FIG. 1 shows a vehicle electrical system with safety-relevant components.

FIG. 1 shows a possible topology of a power supply system, consisting of a basic vehicle electrical system 10, which comprises an energy storage system 12, in particular a battery 12 with associated battery sensor 14, and a plurality of consumers 16, which are protected or activated or supplied by an electronic power distribution board 18. The energy storage system 12 is likewise connected to the electronic power distribution board 18. The electronic power distribution board 18 comprises a plurality of switching means (i.e., switches) 15, which in each case in particular activate or protect or supply safety-relevant consumers 16. The switching means 15 could thus be semiconductor switches, which function as an electronic fuse for example according to specific criteria such as (over) voltage, (over) current, temperature etc. and isolate the respective protected consumer 16 from the power supply in inadmissible operating states. The switching means 15 are here in each case parallel-switched. A further power distribution board 13 is, for example, connected to a further switching means 15 of the electronic power distribution board 18, via which further consumers 17 are protected (for example via safety fuses) and purposefully supplied with power. The consumers 17 may for example be lights, windshield wipers or such consumers 17 as come into use for example after a crash. Furthermore, the electronic power distribution board 18 comprises a disconnecting means 19. The disconnecting means 19 may preferably comprise a semiconductor switch, for example two serial semiconductor switches with diodes arranged antiparallel to one another (back-to-back). The disconnecting means 19 serves to disconnect the electronic power distribution board 18 from the vehicle electrical sub-system 20 for example in a fault scenario.

The electronic power distribution board 18 is capable of determining corresponding parameters of the consumer 16 such as voltage Uv or current Iv. The electronic power distribution board 18 is furthermore likewise capable of determining corresponding parameters of the energy storage system 12 such as voltage Ub and/or current Ib and/or temperature Tb. The electronic power distribution board 18 contains sensor systems appropriate for this purpose. The electronic power distribution board 18 likewise has appropriate processing means for storing or evaluating acquired quantities. Alternatively, evaluation could also proceed in another control device. The electronic power distribution board 18 may likewise acquire the current or voltage applied to the input (at the "terminal" 30_0).

Furthermore, the electronic power distribution board 18 is capable of delivering signals as a function of the state of the energy storage system 12, on the basis of which signals transition to a safe state is initiated. A higher level control device then for example initiates a safe vehicle stop (travel to the nearest parking lot, immediate stop on the shoulder etc.) and exits autonomous driving.

The consumers 16 activated by the electronic power distribution board 18 could for example include safety-relevant vehicle functions such as for example braking, steering etc.. The safety-relevant consumers 16 could for example also cover important functions in functionally redundant manner.

The electronic power distribution board 18 is connected electrically conductively on the side remote from the energy storage system 12 to a further power distribution board 11. The further power distribution board 11 serves in activation or protection of further consumers 9. The further power distribution board 11 is connected to a DC-DC converter 22. The DC-DC converter 22 serves in voltage transformation between the first basic vehicle electrical system 10, which supplies the consumers 9, 16, 17 with a voltage level U1, and a voltage level U2 of a further vehicle electrical system 20. The basic vehicle electrical system 10 has a lower voltage level U1 compared with the further vehicle electrical system 20, for example a high-voltage vehicle electrical system, for example it may be a 12 V vehicle electrical system. To ensure that power is supplied in particular to the safety-relevant consumers 16, at least one of the consumers 9 can be voltage-dependently degraded in particular in normal operation, by for example reducing, limiting or switching off power consumption. Where degrading functions properly, it is possible, for example in a fault scenario of the energy storage system 12, to ensure an alternative power supply in particular for the safety-relevant consumers 16 via the DC-DC converter 22 and the switch means 19.

The high-voltage vehicle electrical system 20 comprises for example an energy storage system 24, for example a high-voltage battery, if need be with integrated battery management system, a load 26, shown by way of example and which may for example take the form of a convenience consumer such as an air-conditioning system supplied with an elevated level of voltage, and an electrical machine 28. In this connection, high voltage is understood to mean a voltage level U2 which is higher than the voltage level U1 of the basic vehicle electrical system 10. It could, for example, mean a 48 volt vehicle electrical system. Alternatively, in particular in the case of vehicles with a purely electric drive, voltage levels could be still higher.

By way of example, in the exemplary embodiment, a battery or storage battery is described as the possible energy storage system 12, 24. Alternatively, however, other inductively- or capacitively-based energy storage systems suitable for this task may equally well be used, e.g., fuel cells, capacitors or the like.

To implement a safety-relevant vehicle electrical system for manual driving, the topology according to FIG. 1 may in particular be used. In this case, power may be supplied redundantly to the safety-relevant consumers 16 both from the energy storage system 12 and via the "terminal" KL 30_0 (input of the electronic power distribution board 18 or output of the DC-DC converter 22 on the low-voltage vehicle electrical system side) as well as by the DC-DC converter 22, supplied by the further energy storage system 24. The redundancy brought about by the supply via the "terminal" 30_0 can only be ensured if the terminal 30_0 consumer power of the further consumers 9 is below a given threshold. Otherwise, power cannot be supplied to the terminal 30_1 or to the terminal 30_1 loads from the DC-DC converter 22, optionally including dynamic load maneuvers (braking/steering maneuvers to transition into the safe state in self-driving mode), and an inadmissible voltage dip would occur, which could lead to loss of function by the safety-relevant consumers 16 (steering, brakes, etc.).

Many of the described components such as energy storage system 12, 24 and safety-relevant consumers 16 have to meet stringent requirements with regard to reliability, and thus constitute safety-relevant components. To meet the safety requirements at vehicle electrical system level and identify or control battery faults, technical safety measures have to be implemented. This could for example be an electronic battery sensor (EBS) or sensor 14 which ensures smart monitoring of the energy storage system 12 and fault prediction. A theoretical example of this would be the way the Prognostics and Health Management (PHM) of the battery or energy storage system 12 frequently uses the internal resistance Ri of the battery as an essential value. Determination of Ri is frequently based on the change over time of voltage and current:

Precise measurement, therefore, requires a pulse with high peak values. This battery stimulation is normally brought about by the motor start pulse. After one-off start-up of the motor, no comparable momentum arises. Due to zero-current control of the battery, there is often no longer any further battery pulse at all during the drive cycle. However, mandatory standards such as ISO 26262 require sufficient Ri monitoring of the battery. The sole solution in this case would be active stimulation of the battery. This could be achieved by forced switching on of loads, for example seat heating or windshield heating. Given the power consumption or comfort restrictions, this is obviously not a practical approach.

The example given of battery monitoring substantiates the idea that some diagnostic functions or safety measures can in general only be carried out time-discretely or cyclically rather than continuously. There may be multiple reasons for this, such as:

non-availability of the necessary system states,
operating strategy or physical limitations,
scanning rate of electronic components, communications interfaces which are not real-time
capable, bus overload and data loss, protracted, time-dependent calculation methods (e.g.,
Kalman filtering), computing resources.

Such diagnostic or safety measures, which are substantially influenced by cycling, must not be treated as continuous systems in the safety case. From a theoretical standpoint, the systems do not therefore currently add any value to the safety case.

For vehicle systems with an Automotive Safety Integrity Level (ASIL), proof that the implemented safety measures are effective has to be submitted. This is of relevance to safety measures which are applied to prevent faults leading to Single Point Faults (SPFs), or to reduce Residual Faults (RFs). If the fault handling time interval (FHTI) of the safety measure is greater than the fault-tolerant time interval (FTTI), the safety measure must not be considered effective and cannot therefore be taken into account for the purpose of safety validation. The FHTI here encompasses the diagnostic test-time interval (DTTI), which is the limiting factor due to cycling.

As far as the example of battery monitoring is concerned, the safety goal (SG) could be to avoid sudden loss of steering support due to an insufficiently powerful battery. Loss of steering function can be classified as acceptable as long as it does not last longer than 100 ms. The FTTI therefore amounts to 100 ms for this safety goal. This means that the specific safety measure, including battery monitoring for identification of the specific fault, has to be carried out within the FTTI of 100 ms. As mentioned, this might not be possible under normal conditions.

The following statement generally applies: safety measures which are influenced by cycling may possibly violate the criterion FHTI≤FTTI. According to the safety validation process of ISO 26262, these safety measures must not be taken into account when validating SPFs and RFs due to the influence of systematic faults. To change this situation, this document describes a novel approach to the safety validation process of safety measures with points in time at which FHTI≥FTTI applies.

This technical development derives a new mathematical approach to calculating a probability metric for random hardware failures (hereinafter PMHF: Probabilistic Metric for Random Hardware Failure) for functions which relate to cyclic safety measures with a diagnostic coverage (hereinafter DC). In this case, the probability function of the exponential fault distribution is adapted to the cyclic influence of the safety diagnosis. All time-dependent safety aspects of the system behavior are taken into account. This leads to a piecewise-defined failure rate function, which is applied by integration in the exponent of the cumulative distribution function. A suitable approximation method yields a new definition for a cyclic DC rate and the associated methodology of the PMHF calculation for the safety case. A time-discrete approach to the defined cyclic calculation method may moreover be applied to predictive diagnoses used in self-driving vehicles and/or in vehicle electrical systems with stringent safety requirements such as the one shown by way of example in FIG. 1. This relates in particular to future vehicle applications. The methodology is additionally extended to the effect that it becomes possible to model functionalities in the safety case which are monitored by two alternating safety measures/safety mechanisms/diagnostic systems.

Definition of a Technical Safety Measure:

Technical safety measures are solutions for identifying or controlling random hardware faults or for mitigating their harmful impacts. A safety mechanism, on the other hand, is a technical solution which is implemented by electrical or electronic (E/E) functions for fault identification, mitigation or tolerance and for fault control or prevention. They ensure intended functionality or achieve a safe system state.

Definition of Residual Fault:

A Residual Fault (RF) is the part of a random hardware fault that can go as far as to violate the safety goal. This part is not controlled by any safety mechanism. Unlike a Single Point Fault, the residual part of the hardware element fault is treated by a safety mechanism.

Random Quantities:

Exponential distribution is used to ascertain random hardware faults in E/E systems. According to ISO 26262, these systems cannot be repaired. The failure rate $\lambda$ therein is considered constant. The unit $\lambda$ denotes Failure In Time (FIT), i.e., the number of faults over $10^9$ operating hours of the device. The associated probability density function is:

$$f(t) = \lambda \cdot e^{-\lambda \cdot t}$$

The associated cumulative distribution function is stated as:

$$F(t) = \int f(t) = 1 - e^{-\lambda \cdot t}$$

Diagnostic Coverage (DC) is the percentage of the failure rate $\lambda$ of a hardware element or a fault mode which is identified or treated by implementation of a safety mechanism:

$$DC = \lambda_{dd}/\lambda_d = \lambda_{dd}/(\lambda_{dd} + \lambda_{du})$$

this including the failure rate fraction of hazardous faults $\lambda d$, faults identified as hazardous $\lambda dd$ and faults not identified as hazardous $\lambda du$. In the static/continuous case, the following thus applies:

| Parameter | static |
|---|---|
| DC | $DC_{stat} = \dfrac{\lambda_{DD_{stat}}}{\lambda_{DD_{stat}} + \lambda_{DU_{stat}}} = \dfrac{\lambda_{DD_{stat}}}{\lambda_D}$ |
| $\lambda_{DD}$ | $\lambda_{DD_{stat}} = DC_{stat} \cdot \lambda_D$ |
| $\lambda_{DU}$ | $\lambda_{DU_{stat}} = (1 - DC_{stat})\lambda_D$ |
| f(t) | $f(t)_{stat} = (1 - DC_{stat})\lambda_D \cdot e^{-(1-DC_{stat})\lambda_D \cdot t}$ |
| F(t) | $F(t)_{stat} = (1 - e^{-(1-DC_{stat})\lambda_D \cdot t}$ |

And for the PMHF metric with T_L=operational lifetime:

$$PMHF = \frac{Prob(T \le T_L)}{T_L} = \frac{\int_0^{T_L} f(\tau) \cdot d\tau}{T_L} = \frac{F(T)|_{t=T_L}}{T_L}$$

Influence of Cyclic Diagnostics:

The way in which cyclic diagnostics work is explained on the basis of a theoretical example: a system is considered which is suffering from random hardware faults which may lead to safety goal violation. The effects of the faults are monitored using a safety measure with a diagnostic coverage DC of 100% and the system is brought into the safe state. However, this monitoring is only carried out in a time interval, specifically cyclically. In this time interval and in the event of an identified and controlled fault, the system may be brought into a safe state within the FTTI (Fault Tolerant Time Interval, hereinafter FTTI). For example, failure rate=10 FIT, monitored interval Int.2, DC=100%.

Figure 2:
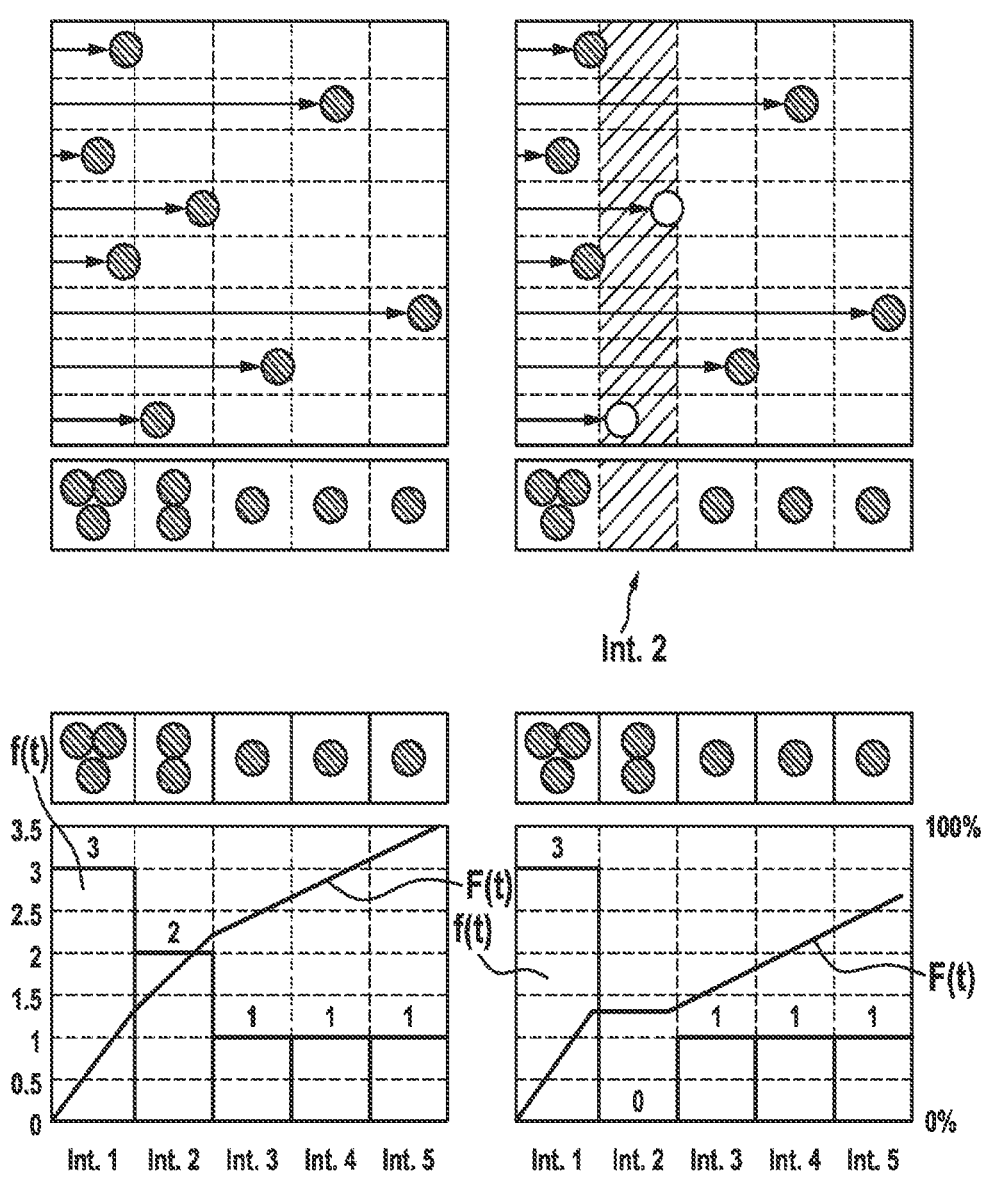
FIG. 2 shows a system without (left) and with (right) monitoring, with critical fault scenarios (top) and, at the bottom, the associated fault density (f(t), represented by a bar) and fault distribution (F(t), represented by a line curve) being depicted.

FIG. 2 top left shows the system without monitoring, top right with monitoring. The representations at the bottom of FIG. 2 show that the empirical density (f(t), shown bottom of FIG. 2 as a bar) and thus also the associated distribution function (F(t), likewise shown bottom of FIG. 2, as a line curve), change in the interval 2 Int2. With the definition of DC, the failure rate $\lambda$ for the interval 2 is expressed as:

$$\lambda_{Int\text{-}2,SM} = \lambda \cdot (1 - DC) = 10 \; FIT \cdot (1 - 100\%) = 0$$

The density function or probability density function f(t) falls in interval 2 to 0, which leads to a stagnating distribution function in this interval. The probability F(t) or cumulative distribution function thus falls over the entire operating period. This process then repeats cyclically.

Time Periods

ISO 26262 states the time periods which are of relevance to a safety measure. These comprise, as in part apparent by way of example in FIG. 3:

FHTI: Fault Handling Time Interval.

FDTI: Fault Detection Time Interval

FRTI: Fault Reaction Time Interval.

DTTI: Diagnostic Test Time Interval.

CETI: Cause Effect Time Interval (not explicitly defined).

FTTI: Fault Tolerant Time Interval

A completed cyclic diagnosis is labeled $T_{Diag}$. On the basis of the time sequences, the points in time of the earliest controllable fault and last possible controllable fault can be identified. This results in a controllable period $t_c$ and the other, uncontrollable periods $t_D$.

Figure 3:
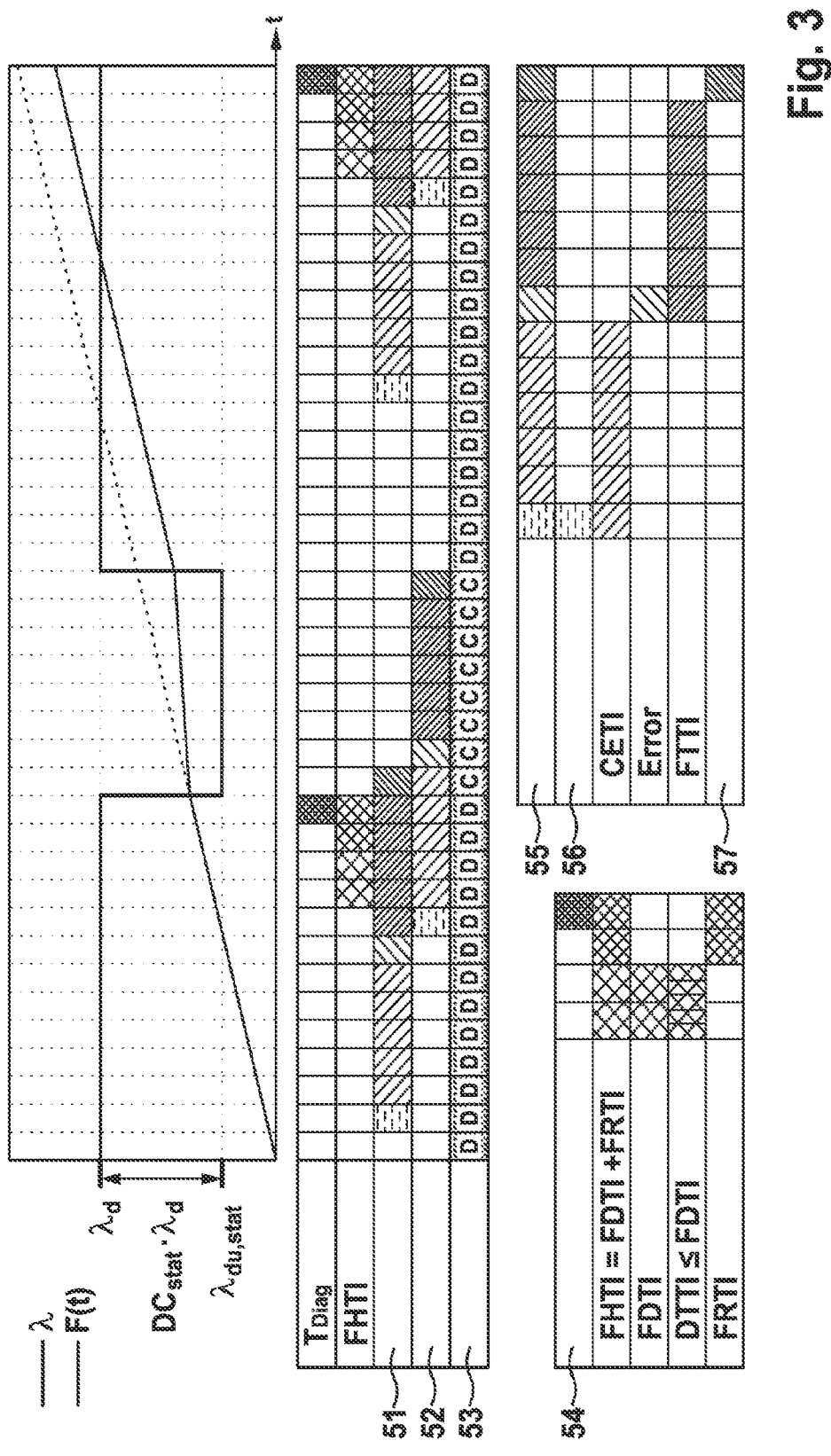
FIG. 3 shows the time-dependent profile of the failure rate A with associated failure probability F (t), with different time intervals being depicted, in particular with a view to controllability etc.

FIG. 3 plots the time profile over a plurality of small time intervals of identical size. The quantities Tdiag, FHTI, 51 (denotes the first controllable point in time), 52 (denotes the last controllable point in time), the system state 53 (all controllable periods are labeled with a C, the uncontrollable periods with a D) are stated in addition to the time profile of the failure rate $\lambda$ and failure probability F (t).

The patterns described by the above-stated curves are shown in greater detail in the diagrams at the bottom of FIG. 3, with 54 denoting the cyclic safety measure. The next line shows FHTI, composed of FDTI+FRTI (as shown accordingly in the upper block in the line FHTI and the respective individual lines therebelow). The line below shows FDTI, below that DTTI≤FDTI, and below that FRTI.

The adjoining right-hand block shows at the top, by way of example, a faulty behavior 55, as also appears the top block above at 51 or 52. Below the faulty behavior 55, the next line contains block 56, which relates, by way of example, to the "Root Cause". Under this appears *CETI*, then Error, then FTTI and then 57, which denotes a fault or safety requirement violation for the respective shortest time intervals or periods (which correspond to those of the top block).

From the standpoint of the system, the failure rate $\lambda$ thus behaves as a piecewise-defined and thus time-dependent function as shown in FIG. 3 with:

$$\lambda = \begin{cases} \lambda_{du,stat}, & \text{if } t \in t_C \\ \lambda_d, & \text{if } t \in t_D \end{cases} = \begin{cases} (1 - DC_{stat}) \cdot \lambda_d, & \text{if } t \in t_C \\ \lambda_d, & \text{if } t \in t_D \end{cases}$$

The DC value is thus also defined piecewise:

$$DC(t) = \begin{cases} DC_s & t \in t_{cont} \\ 0 & t \in t_{uncont} \end{cases}$$

with DC_s being the intrinsic or static diagnostic coverage level. The resultant fault rate $\lambda_{RF}$ of the cyclically monitored fault, as defined to ISO 26262:

$$\lambda_{RF} = \lambda_0 \cdot (1 - DC)$$

$$\lambda_{RF}(t) = \lambda_0 \cdot (1 - DC(t))$$

is accordingly not a constant fault rate. The error rate ARE may accordingly be defined as:

$$\lambda_{RF}(t) = \begin{cases} \lambda_0 \cdot (1 - DC_s) & t \in t_{cont} \\ \lambda_0 \cdot (1 - 0) & t \in t_{uncont} \end{cases}$$

For a non-constant failure rate $\lambda$ (t), application of the exponential distribution is not entirely useful. First of all, the general definition of failure density f(t) and failure probability F(t) must be used. Failure probability F(t) can then be represented as the integral of failure density f(t) and introduced into the calculation of survival probability R(t).

$$f(t) = R(t) \cdot \lambda(t)$$

$$F(t) = 1 - R(t)$$

$$\int f(t)dt = 1 - R(t)$$

$$R(t) = 1 - \int f(t)dt$$

It should be noted that the calculation of failure density f(t), which represents the rate of change of the survival probability R(t), itself contains the survival probability R(t). It is therefore a first order differential equation. With the assistance of the transformations shown, this can be described by:

$$\frac{dR}{dt} = \dot{R}(t) = -f(t) = -R(t) \cdot \lambda_{RF}(t)$$

$$R(0) = 1$$

In the case of fault rates $\lambda(t)$ variable over time, the failure-describing functions are not subject to exponential distribution laws. The survival probability R in the case of failure rates λ(t) variable over time can be directly described using the solution of the differential equation with:

$$R(t) = e^{-\int_0^t \lambda(t)dt} \qquad 5$$

This results, in comparison to the transformation of the differential equation, in a simplification of the implementation within the numerical calculation with the same result. To determine the failure probability of the modeling variant introduced here, recourse is therefore had to F(t)=1−R(t), with application of the solution of the differential equation with R(t).

If this mathematical action is implemented, a distinction must be drawn between two start conditions: 1) at point in time 0 the system is monitored (curve 1 in FIG. 4) or 2) at point in time 0 the system is not monitored (curve 2 in FIG.

Approximation

According to the piecewise-defined behavior of the failure rate, a weighted average is formed over the failure rate:

$$\lambda_{korr.} = \lambda_0 \cdot \left(1 - \frac{t_c}{t_c + t_d}\right) + \lambda_0 \cdot \frac{t_c}{t_c + t_d} \cdot (1 - DC_{stat})$$

The following applies with K_c=tc/(tc+td):

$$\lambda_{korr.} = \lambda_0 \cdot ((1 - K_c) + K_c \cdot (1 - DC_{stat}))$$

A coefficient comparison with the original definition yields the following parameters for the approximation:

| Parameter | cyclic V1 |
|---|---|
| DC | $DC_{cycl} = K_c \cdot DC_{stat}$ |
| K | $K_{M_i} = K_c = \dfrac{t_c}{t_c + t_d} = \dfrac{t_c}{t_{Ding}}$ |
| $\lambda_{DD}$ $\lambda_{DU}$ | $\lambda_{DD_{cycl}} = K_c \cdot DE_{stat} \cdot \lambda_D$ $\lambda_{DU_{cycl}} = (1 - K_c \cdot DC_{stat}) \cdot \lambda_D$ |
| f(t) | $f(t)_{cycl} =$ $K_c \cdot \lambda_{DU_{stat}} \cdot e^{-[K_c \cdot \lambda_{DU_{stat}} + (1-K_c)\lambda_D]t} + (1 - K_c)\lambda_D \cdot e^{-[K_c \cdot \lambda_{DU_{stat}} + (1-K_c)\lambda_D]t}$ |
| F(t) | $F(t)_{cycl} = 1 - e^{-(1-K_C DC_{stat})\lambda_d \cdot t} = 1 - e^{-(1-DC_{cycl})\lambda_D \cdot t}$ |

Figure 4:
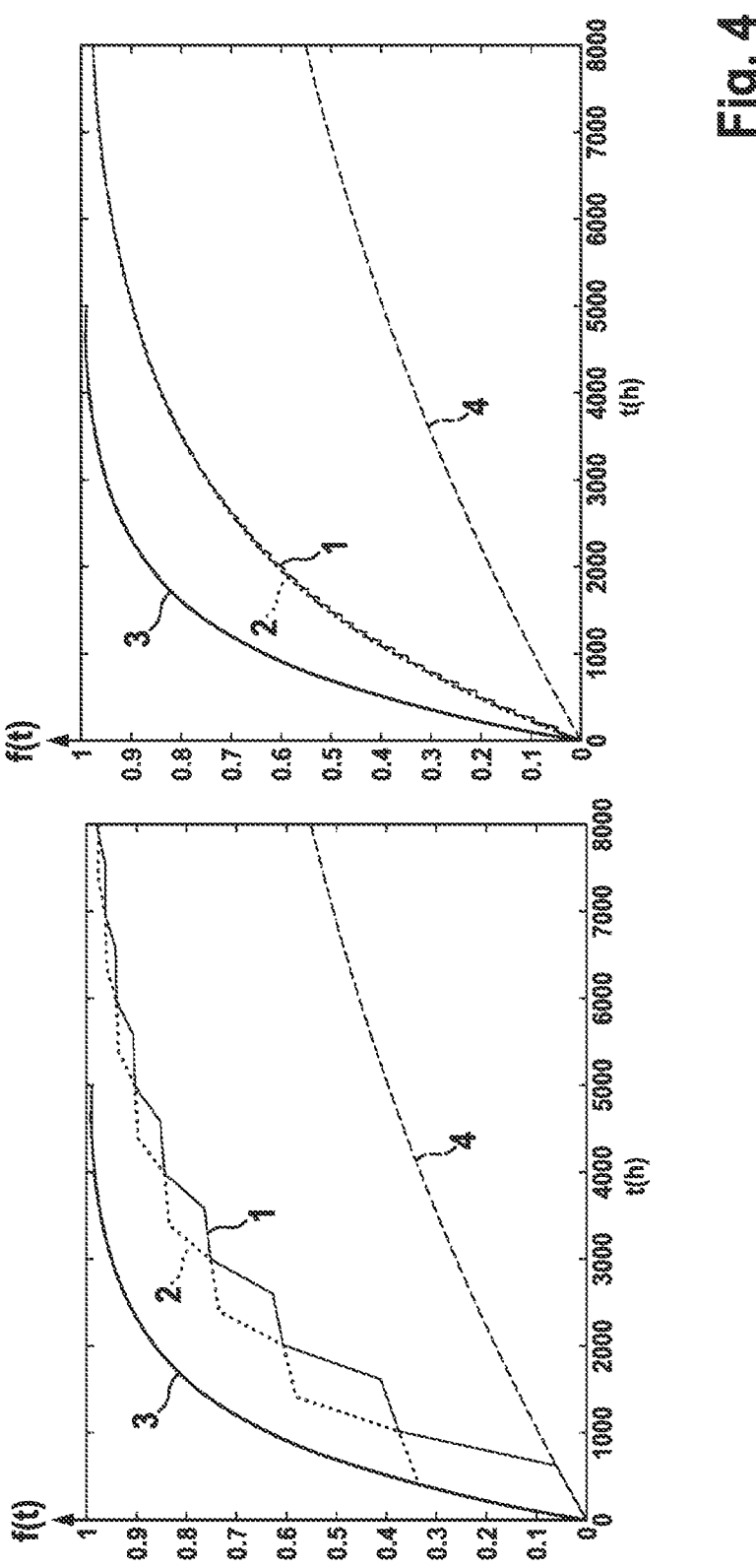
FIG. 4 shows failure probability F (t) plotted over time for different operating cases.

4). Accordingly, the failure probability function begins with a smaller (monitored) or larger (not monitored) gradient. An example of this is shown in FIG. 4. Failure probability F(t) is here plotted as a function of time in h. In addition to the curves 1 (control at start) and 2 (non-control at start) already described, a curve without monitoring (curve 3) is shown, as well as a static diagnosis (curve 4).

All parameters are described as follows:

| Parameter | cyclic R (t) |
|---|---|
| DC | $DC(t) = \begin{cases} DC_{stat} & t\epsilon t_{cont} \\ 0 & t\epsilon t_{uncont} \end{cases}$ |
| K | — |
| $\lambda_{DD}$ | $\lambda_{DD}(t) = \begin{cases} \lambda_D \cdot DC_{stat} & t\epsilon t_{cont} \\ 0 & t\epsilon t_{uncont} \end{cases}$ |
| $\lambda_{DU} = \lambda_{RF}$ | $\lambda_{DU}(t) = \begin{cases} \lambda_D \cdot (1 - DC_{stat}) & t\epsilon t_{cont} \\ \lambda_D \cdot (1 - 0) & t\epsilon t_{uncont} \end{cases}$ |
| R(t) | $R(t) = e^{-\int_0^t \lambda(t)dt}$ |
| f(t) | $f(t) = R(t) \cdot \lambda(t) = \lambda(t) \cdot e^{-\int_0^t \lambda(t)dt}$ |
| F(t) | $F(t) = 1 - R(t) = 1 - e^{-\int_0^t \lambda(t)dt}$ |

Although the derived methodology is precise in every point, it can be implemented only with effort. An approximation with which the system behavior can be analytically described is therefore performed.

Figure 5:
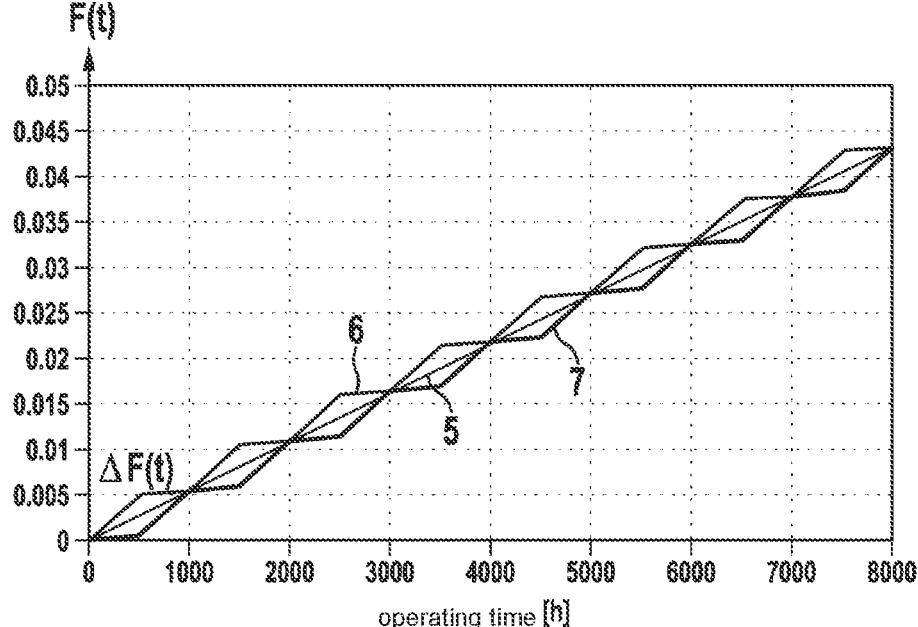
FIG. 5 shows failure probability F (t) plotted over time in different approximations relative to the actual curve.

The approximated analytical function of the failure probability of a system, which underlies a cyclic diagnosis, can be represented for example in FIG. 5. FIG. 5 plots various failure probabilities F (t) against operating time (in hours). Curve 5 shows a cyclically corrected failure probability rate F(t)_zykl._korr._Rate, curve 6 a real failure probability F(t) for an uncontrolled start, and curve 7 a real failure probability F(t) with controlled start F(t).

The approximation difference ΔF(t) becomes smaller as the diagnostic test interval shrinks. The following therefore applies:

$$\lim_{\Delta T_{Diag} \to 0} \Delta F(t) = 0$$

The functions thus move closer together.

Figure 6:
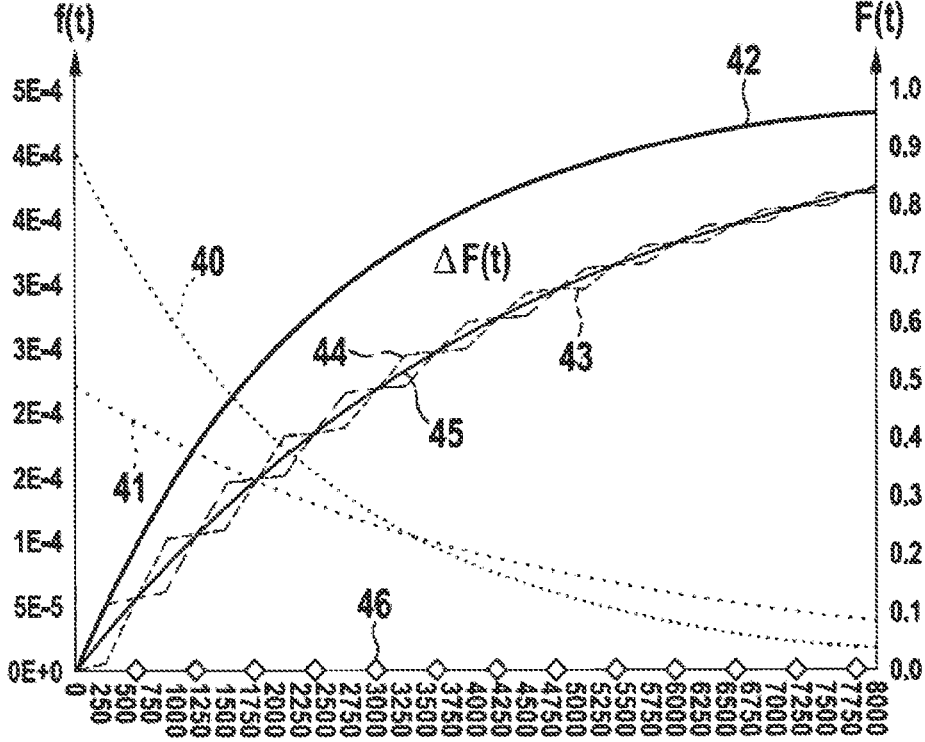
FIG. 6 shows a representation of fault density f (t) and failure probability F (t) for different operating cases.

As illustrated graphically in FIG. 6, the following final consideration results with the representation of the original failure probability without adding the explained methodology (curve 42), the numerical calculation by differential equation (43: F(t)start_contr.; 44: F(t)start_uncontr.), the approximated distribution of a cyclically monitored function (45: F(t)_cyclic), and the respective density functions (40: f(t)_total; 41: f(t)_cyclic), thereof, plotted over the lifetime T. 46 denotes the cyclic diagnosis points T_Diag.

In FIG. 6, the described curves are shown by way of example for λ=400 k FIT|DC_stat=0.9|K_c=0.5|T_Lifetime=8000 h|T_Diag=600 h.

The difference between line 45 and line 42 represents the positive influence on the safety case brought about by the derived cyclical safety measure methodology.

The novel "F(t)_cyclic" (45) approach with the weighted failure rate and the associated density function f(t)_cyclic (41) of the piecewise-defined failure rate corresponds to the modeling of cyclic effects, even if FHTI≥FTTI. The described model corresponds to the ISO 26262 definitions and extends the standard method of continuous diagnosis with an adaptable and general approach to static or cyclic safety measures. Prior art approaches do not allow any modeling of this type of system behavior. In contrast, the safety system itself or the hardware functions would need to be newly developed (e.g., redundancies or more suitable hardware elements), in order to reduce F(t) and thus also the PMHF values. In contrast thereto, a reduction in system failure probability F(t) could be achieved overall with ΔF(t), if the novel approach to the implemented safety system is applied. Furthermore, the PMHF value decreases, which also has a positive effect on the safety case.

Adaptation of Alternating Safety Measures:

It should moreover be mentioned that the methodology can be adapted to alternating safety measures (safety measure_1 and safety measure_2 take turns cyclically):

| Parameter | cyclic DC Alternating |
|---|---|
| DC | $DC(t) = \begin{cases} DC_{stat1} & t \in t_{cont1} \\ DC_{stat2} & t \in t_{cont2} \end{cases}$ |
| K | — |
| $\lambda_{DD}$ | $\lambda_{DU}(t) = \begin{cases} \lambda_D \cdot DC_{stat1} & t \in t_{cont1} \\ \lambda_D \cdot DC_{stat2} & t \in t_{cont2} \end{cases}$ |
| $\lambda_{DU}$ | $\lambda_{DU}(t) = \begin{cases} \lambda_D \cdot (1 - DC_{stat1}) & t \in t_{cont1} \\ \lambda_D \cdot (1 - DC_{stat2}) & t \in t_{cont2} \end{cases}$ |
| $\lambda_{DU_{cycl}}$ | $\lambda_{DU_{cycl}} = (1 - [K_{c1} \cdot DC_{stat1} + (1 - K_{c1}) \cdot DC_{stat2}]) \cdot \lambda_D$ |
| f(t) | $f(t) = \lambda_{DU_{cycl}} \cdot e^{-\lambda_{DU_{cycl}} \cdot t}$ |
| F(t) | $F(t) = 1 - e^{-(1 - [K_{c1} \cdot DC_{stat1} + (1 - K_{c1}) \cdot DC_{stat2}]) \cdot \lambda_D \cdot t}$ |

The system assessment with cyclic detection can be used to influence concrete designs of safety-relevant systems or safety-relevant components. The following parameters are stated by way of example: FTTI=100 ms, DC=90%, failure rate λ=200,000 FIT=2E-4, T_L=8000 h. These parameters lead to the following system assessment with cyclic detection:

$$F(t) = 1 - e^{-(1 - K_C \cdot DC) \cdot \lambda \cdot t} =$$
$$1 - e^{-(1 - 0,8 \cdot 0,9) \cdot 2E - 4 \cdot 8000h} = 0,361095316 \rightarrow PMHF = 45.137 \; FIT$$

For system assessment with cyclic detection, the PMHF rises monotonically for FHTI>FTTI, without jump positions and with a slight gradient. The DTTI of the diagnostic system may be adapted until the PMHF target value is reached (for example at 60,000 FIT). This proceeds for example by reducing sensor scan rates or computing resources, either by hardware intervention (CPU etc.) or software adaptations (generally known as downsampling).

Alternating behavior: for example: FTTI=100 ms, DCS1=99%, DCS2=60%, λ=200,000 FIT=2E-4, T_L=8000 h, KC1=0.2

The monitoring function consists primarily of a continuous diagnosis (DC_S2) with a diagnostic quality of DC=60%. FHTI is always <FTTI (continuous behavior). As a result of system behavior, a calibration (or the like) can be initiated with the period T_Diag, which raises diagnostic quality for a specific period to DC_S1=99% (for example after starting up the system and running through initialization). These periodic system states have per se a cyclic behavior with in each case FHTI>FTTI. Due to the cyclic test method, the system may be considered an intermittent safety system. A comparison is performed, which clarifies the positive effect of adding the cyclic fraction to the existing system.

System $DC_{S2}$ without cyclic fraction = alternating system $DC_{S1}$ and $DC_{S2\,new}$, $$1 - e^{-(1 - DC_{S2}) \cdot \lambda \cdot t} = 1 - e^{-(1 - [K_{C1} DC_{S1} + (1 - K_{C1}) DC_{S2,new}]) \cdot \lambda \cdot t}$$

$$DC_{S2,new} = \frac{DC_{S2} - K_{C1} \cdot DC_{S1}}{1 - K_{C1}} = \frac{0.6 - 0.2 \cdot 0.99}{1 - 0.2} = 0,5025$$

$$0,5025 < DC_{S2} = 0.6$$

By adding in the cyclic fraction of the diagnosis, the primary diagnostic function DC_S2 can be diminished (in the example from 60% to 50.25%), the result and target values (PMHF) remaining the same. This increased degree of freedom has a substantial effect on the diagnostic system and its interpretation. Adaptation of the components in respect of tolerance metrics or drift (for example capacitors, resistors) would thus be possible, analog-digital converters (ADC) might need a lower resolution, and temperature dependencies of the measuring system could be ignored, to the point of eliminating sensor signals (as these are no longer needed for accuracy).

The described method could for example be used, in the case of the sensor 14 described by way of example, which serves in monitoring of the energy storage system 12, in particular an electronic battery sensor, in particular for diagnoses during startup/power-down.

The described method could likewise be used for functions for monitoring the energy storage system 12, for example for cyclic discharge monitoring, a cyclic aging counter or the safety-relevant determination of the proper functional state of the energy storage system 12. The method is likewise particularly suitable for the electronic power distribution board 18, in particular for diagnoses during power-up or power-down. Use is however not limited thereto, these are merely stated by way of example.

What is claimed is:

1. A method for monitoring a safety-relevant electrical component of a motor vehicle, for a self-driving function, the method comprising the following steps:
   providing the safety-relevant component for the motor vehicle; and
   carrying out a cyclic diagnosis of the safety-relevant component, a metric for failure probability being determined for the safety-relevant component by using a piecewise- and time-dependently defined failure rate of the component.

2. The method as recited in claim 1, wherein the failure rate exhibits at least one jump.

3. The method as recited in claim 1, wherein, for the cyclic diagnosis with a diagnosis period: (i) a period of a controllable fault of the component is determined and/or a period of an uncontrollable fault of the component is determined.

4. The method as recited in claim 3, wherein: (i) a constant failure rate for unidentified hazardous faults is assigned to the period of a controllable fault, and/or (ii) a further constant failure rate of hazardous faults of the component is assigned to the period of an uncontrollable fault.

5. The method as recited in claim 3, wherein a failure rate in the form of a distribution is assigned to the period of a controllable fault.

6. The method as recited in claim 5, wherein the distribution is a Weibull distribution.

7. The method as recited in claim 1, wherein: (i) the piecewise- and time-dependently defined failure rate is integrated to obtain the metric for failure probability, and/or (ii) a weighted average is determined from the piecewise- and time-dependently defined failure rate to obtain the metric for failure probability.

8. The method as recited in claim 1, wherein the following differential equation is solved to determine a failure probability (F(t)) and/or a survival probability (R (t)), $\lambda_{RF}$ denoting the piecewise- and time-dependently defined failure rate ($\lambda$(t)):

$$\frac{dR}{dt} = \dot{R}(t) = -f(t) = -R(t) \cdot \lambda_{RF}(t)$$

$$R(0) = 1$$

9. The method as recited in claim 1, wherein a failure probability (F(t)) and/or a survival probability (R (t)) is determined as a function of the piecewise-defined failure rate ($\lambda$(t)), integration of the failure rate ($\lambda$(t)) in an exponent of survival probability (R (t)).

10. The method as recited in claim 4, wherein the failure probability (F(t)) is calculated using the following formula:

$$F(t) \quad F(t)_{cycl} = 1 - e^{-(1-K_c DC_{stat})\lambda_D \cdot t} = 1 - e^{-(1-DC_{cycl})\lambda_D \cdot t}$$

in which:
Kc=tc/(tc+td),
tc denotes the period of a controllable fault of the component,
td denotes the period of an uncontrollable fault of the component,
DCstat denotes a diagnostic coverage including a percentage of a failure rate identified using a static or continuous diagnosis,
DCcycl denotes a diagnostic coverage including a percentage of a diagnostically identified failure rate during cyclic diagnosis, and $\lambda$d denotes a failure rate of hazardous faults of the component.

11. The method as recited in claim 1, wherein a probability density function is determined by way of a product of the failure rate and an exponential function with a negative integral over the failure rate in an exponent of the exponential function.

12. The method as recited in claim 1, wherein: i) a failure rate for hazardous faults is assigned during a static or continuous diagnosis for determining the metric for failure probability for the safety-relevant component, and/or ii) a percentage of the failure rate for hazardous faults of the safety-relevant component identified during a static or continuous diagnosis is used as a diagnostic coverage.

13. The method as recited in claim 3, wherein a cyclic diagnostic coverage is determined as a function of: i) a static diagnostic coverage and/or a quotient of the period of an uncontrollable fault and a sum of the period of a controllable fault and the period of an uncontrollable fault, and/or ii) a quotient of a period of a controllable fault and a period of a completed cyclic diagnosis, and/or iii) a failure rate for hazardous faults.

14. The method as recited in claim 1, wherein the method is used for at least two alternating diagnoses.

15. The method as recited in claim 3, wherein the probability function (F (t)) takes the following form for alternating first and at least second diagnoses:

$$F(t) = 1 - e^{-(1-Kc_1 \cdot DCstat_1 + (1-Kc_1) \cdot DCstat_2)) \lambda D \cdot t}$$

in which:
Kci=tci/(tci+tdi),
tci denotes the period of a controllable fault of the component,
tdi denotes the period of an uncontrollable fault of the component,
DCstat_i denotes a diagnostic coverage including a percentage of the failure rate identified using a static or continuous diagnosis,
$\lambda$d denotes a failure rate for hazardous faults of the component, and
i equals 1 (for the first diagnosis) or 2 (for the second diagnosis).

16. The method as recited in claim 1, wherein at least one control device and/or at least one sensor and/or at least one electronic power distribution board, is provided for diagnosis of the component.

\* \* \* \* \*